United States Patent
Pilo et al.

(10) Patent No.: US 9,564,180 B1
(45) Date of Patent: Feb. 7, 2017

(54) DEEP-SLEEP WAKE UP FOR A MEMORY DEVICE

(71) Applicant: Invecas, Inc., Santa Clara, CA (US)

(72) Inventors: Harold Pilo, Underhill, VT (US); Michael Lee, Bronxville, NY (US)

(73) Assignee: Invecas, Inc., Santa Clara, CA (US)

( * ) Notice: Subject to any disclaimer, the term of this patent is extended or adjusted under 35 U.S.C. 154(b) by 0 days.

(21) Appl. No.: 15/192,697

(22) Filed: Jun. 24, 2016

(51) Int. Cl.
*G11C 5/14* (2006.01)

(52) U.S. Cl.
CPC ..................................... *G11C 5/148* (2013.01)

(58) Field of Classification Search
CPC .... G11C 2207/2227; G11C 5/144; G11C 7/20
See application file for complete search history.

(56) References Cited

U.S. PATENT DOCUMENTS

| 2008/0279017 A1* | 11/2008 | Shimano | G11O 5/063 365/189.06 |
| 2009/0213673 A1* | 8/2009 | Flautner | G06F 12/0893 365/203 |

* cited by examiner

*Primary Examiner* — Tuan T Nguyen
(74) *Attorney, Agent, or Firm* — Venture Pacific Law, PC

(57) ABSTRACT

A memory device comprises memory banks, power gates, and bank wake-up circuits. Each of the memory banks has a core voltage supply. The power gates are coupled to the memory banks for charging the core voltage supplies and have a plurality of powering modes. The bank wake-up circuits are coupled to the power gates for selecting one of the plurality of power modes for charging the memory banks during a wake-up mode. The bank wake-up circuits sense the core voltage supplies during the wake-up mode. The bank wake-up circuits serially charge the memory banks as a function of the sensed core voltage supplies of the memory banks.

20 Claims, 6 Drawing Sheets

DEEP-SLEEP WAKE UP FOR A MEMORY DEVICE

FIELD OF INVENTION

The disclosure relates to a memory device, and, more particularly, to a system, method, and circuit for powering the memory device from a sleep mode.

BACKGROUND

A memory device may include a deep sleep or light sleep mode, which is an operating mode in which the memory banks of the memory device are in a reduced power state or altogether completely shut off. The use of a sleep mode reduces the amount of electrical power consumed in comparison to an awake or normal operating mode of the memory device.

FIG. 1 illustrates a prior art block diagram of a memory device with some memory instances in a deep-sleep mode. A memory device 10 comprises memory instances 8 and 12. The memory instances 8 are in a deep-sleep mode and the memory instances 12 are in a normal active mode (also referred to as a functional mode). When some or all of the memory instances 8 are woken up, there is a pull down effect on the power supply to the memory device.

For instance, when the memory instances 8 are switched to an active state, the internal core voltage supplies for these instances 8 are woken up by charging them. This causes a current surge on the power supply, which can be very large. The current from the power supply can significantly droop due to the instantaneous current consumed to charge the memory instances. The power supply can droop low enough that the currently active memory instances 12 may fail.

Furthermore, there is typically a switch that gates the power supply to each of the memory instances. When the switch is opened (meaning the respective instance is not being powered), the internal core voltage supply of the respective instance drains to ground due to voltage leakage. Eventually, the bitcells of the memory instance will lose its contents since the internal power will drop below a minimum voltage to keep the contents stored in the bitcells. In order to gain power savings, power gating or a light sleep mode is applied in which the internal core voltage supply is intentionally dropped a little in voltage (e.g., dropped about 100 mV).

FIG. 2 illustrates a graph of a power supply that is pulled down by memory instances being woken up. The graph of a power supply has two voltage rails one set at a voltage VCS and one set at ground. When the memory instances are woken up, the power surge will cause the VCS and ground voltages to droop below a minimum operating voltage range $V_{min\ Fail}$. The memory instances must be operated at a range greater than the minimum operating voltage range to perform reliably. Due to the power source drooping below the minimum operating voltage range, the already active memory instances may undesirably fail and lose its stored data.

In order to combat such issues, prior art has developed various methods for preventing active memory failures. In one method, the current surge from waking the memory banks is reduced by having an inverter delay chain that charges one bank first, and then a next bank after a preset amount of time has elapsed. The delay can be programmed into the inverter delay chain. In other words, the banks are turned on in a stagger manner using delay elements to provide time delays for such staggering. However, a drawback of this method is that it's slow. Additionally, the performance of the inverter delay chain elements can undesirably change the wake-up current profile due to the process characteristics of the device.

Another prior art method provides for the charging of bit lines of a memory bank for waking up that memory bank. First, the bit lines are allowed to discharge to ground. Next, the bit lines are powered up sequentially using the power supply. The power supply droop is thereby minimized by slowly charging up each of the bit lines one at a time for each of the memory banks. However, in actual application this is not useful since there are a tremendous number of bit lines in each of the memory banks. The amount of circuit overhead alone to individually charge each one of the bit lines is untenable; not to mention the amount of time needed to sequentially charge each bit line is very long.

Therefore, it is desirable to provide new methods, circuits, and systems for waking up memory banks of a memory device to prevent a steep drop in the current of a power supply for the memory device.

SUMMARY OF INVENTION

Briefly, the disclosure relates to a memory device, comprising: memory banks, wherein each of the memory banks has a core voltage supply; power gates coupled to the memory banks for charging the core voltage supplies, wherein the power gates have a plurality of powering modes; and bank wake-up circuits coupled to the power gates for selecting one of the plurality of power modes for charging the memory banks during a wake-up mode, wherein the bank wake-up circuits sense the core voltage supplies during the wake-up mode, and wherein the bank wake-up circuits serially charge the memory banks as a function of the sensed core voltage supplies of the memory banks.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

In the following detailed description of the embodiments, reference is made to the accompanying drawings, which form a part hereof, and in which is shown by way of illustration of specific embodiments in which the present disclosure may be practiced.

Figure 1:
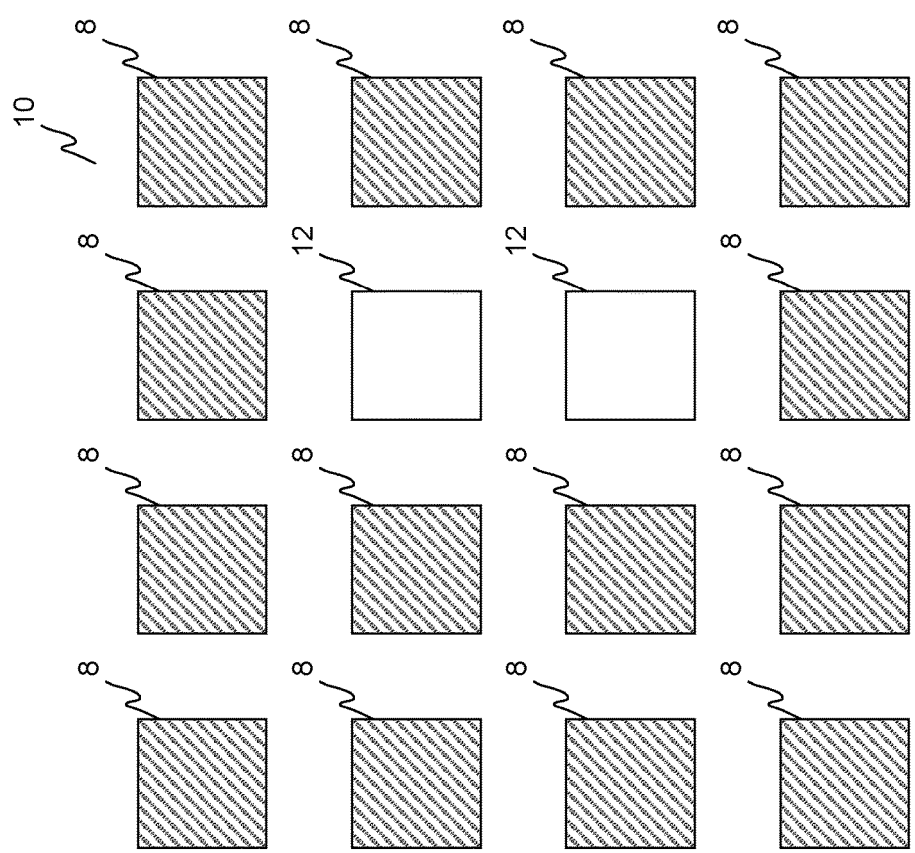
FIG. 1 illustrates a prior art block diagram of a memory device with some memory instances in a deep-sleep mode and others in an active mode.
Figure 2:
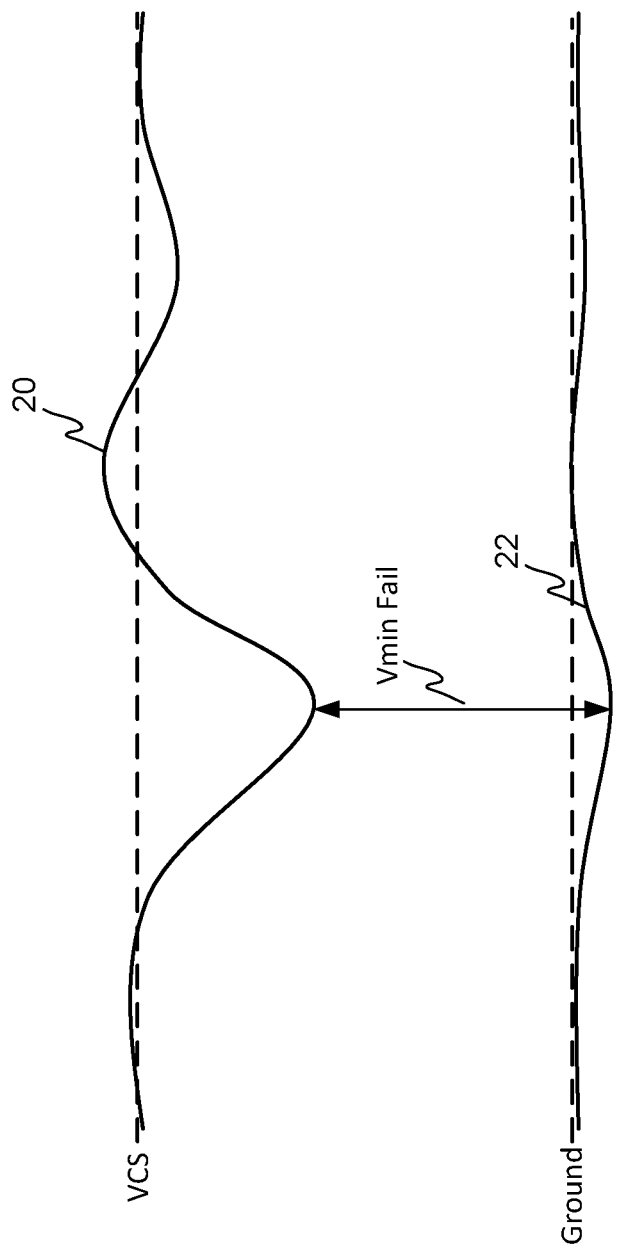
FIG. 2 illustrates a graph of a power supply that is pulled down by memory instances being woken up.
Figure 3:
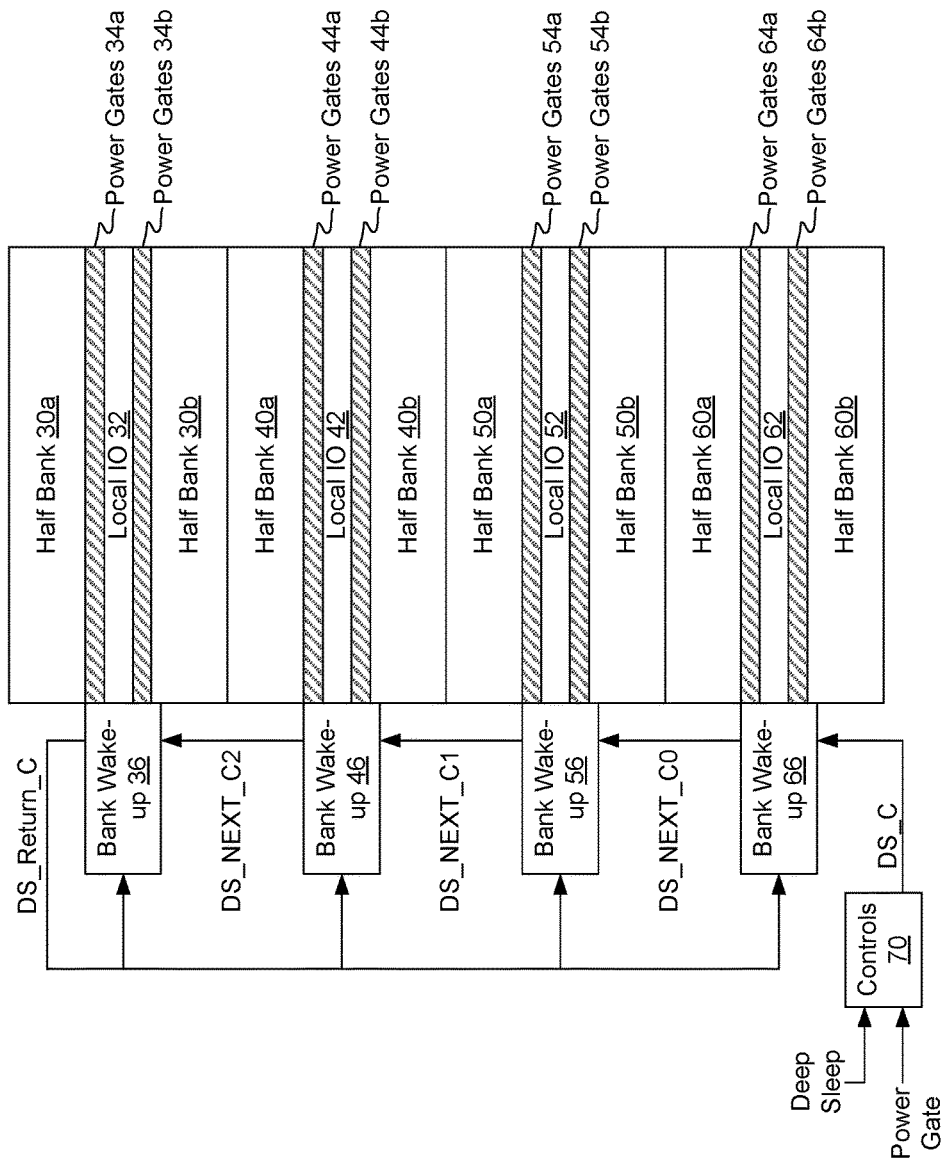
FIG. 3 illustrates a memory device of the present disclosure having bank wake-up circuits for serially waking up sleeping banks.

FIG. 3 illustrates a memory device of the present disclosure having bank wake-up circuits for serially waking up sleeping banks. A memory device of the present disclosure comprises half banks 30*a*, 30*b*, 40*a*, 40*b*, 50*a*, 50*b*, 60*a*, and 60*b*, power gates 34*a*, 34*b*, 44*a*, 44*b*, 54*a*, 54*b*, 64*a*, and 64*b*, local input/output ("IO") circuits 32, 42, 52, and 62, bank wake-up circuits 36, 46, 56, and 66, and control block 70. The local IO circuits 32, 42, 52, and 62 are used to read and write data to the memory bitcells for the selected half bank and are generally well known in the art. The memory device has its storage elements broken into half banks, but it is appreciated that other segmentation schemes for the storage elements can be used in conjunction with the present disclosure. Each half bank has its own corresponding power gates for powering the bitcells of the half bank. The internal power supply for each half bank can be referenced as a core voltage supply ("V_VCS"). The external power supply used for charging the memory banks can be referenced as a voltage signal VCS or Vdd.

Each of the bank wake-up circuits can be coupled to one or more half banks via corresponding power gates for the respective half bank. The bank wake-up circuits can control the wake-up mode of a corresponding half bank. Additionally, a bank wake-up circuit can control two adjacent half banks. For instance, the bank wake-up circuit 36 operates the wake up mode for half banks 30*a* and 30*b* (which can be collectively a single bank) by controlling the power gates 34*a* and 34*b*. The bank wake-up circuit 46 operates the wake up for half banks 40*a* and 40*b* (which can be collectively a single bank) by controlling the power gates 44*a* and 44*b*. The bank wake-up circuit 56 operates the wake up for half banks 50*a* and 50*b* (which can be collectively a single bank) by controlling the power gates 54*a* and 54*b*. The bank wake-up circuit 66 operates the wake up for half banks 60*a* and 60*b* (which can be collectively a single bank) by controlling the power gates 64*a* and 64*b*.

In this example, the half banks 30*a*, 30*b*, 40*a*, 40*b*, 50*a*, 50*b*, 60*a*, and 60*b* are in a sleep mode. During a wake-up mode for these half banks, the bank wake-up circuits 36, 46, 56, and 66 serially charge the core voltage supplies of each of the half banks 30*a*, 30*b*, 40*a*, 40*b*, 50*a*, 50*b*, 60*a*, and 60*b*. The internal core voltage supply for a first one of the half banks is charged to a logic gate trip-point voltage before a next internal core voltage supply for a second one of the half banks is charged. When the internal core voltage supply of the second one of the half banks reaches the logic stage trip-point voltage, an internal core voltage supply for a third one of the half banks is charged. In this manner, all of the half banks are serially charged until all of the power levels of the half banks have reached a predefined voltage level, e.g., VCS. The order of charging of the half banks can be predefined. In the present example, the half banks are charged in consecutive order starting from half bank 60*b* and going upwards until the half bank 30*a* is charged. As noted, the order of charging of the half banks can be altered depending on the design of the respective memory device.

The controls 70 generates a control signal DS_C to initiate the charging of the first half bank, i.e., half bank 60*b*, to be charged by the corresponding bank wake-up circuit 66. As the half banks 60*a* and 60*b* are charged to the logic gate trip-point voltage, then the bank wake-up circuit 66 generates a DS_Next_C0 signal to initiate the next bank wake-up circuit 56 to start charging half bank 50*b* to the logic gate trip-point voltage, and then charge half bank 50*a* to the logic gate trip-point voltage. The remaining bank wake-up circuits 46 and 56 operate similarly. However, when the last half bank 50*a* reaches the logic gate trip-point voltage, the corresponding bank wake-up circuit 36 generates a return signal DS_Return_C to be inputted to the bank wake-up circuits 36, 46, 56, and 66 to engage a second mode of power gating for the half banks 30*a*, 30*b*, 40*a*, 40*b*, 50*a*, 50*b*, 60*a*, and 60*b*.

The controls 70 also receive a deep-sleep input signal and a power gate input signal. The deep-sleep input signal indicates whether any of the half banks are in a deep-sleep mode. The power gate input signal indicates whether any of the half banks are in a power gating mode. Depending on the deep-sleep input signal and the power gate input signal, the controls 70 can operate the bank wake-up circuits 36, 46, 56, and 66 accordingly.

A first group of one or more transistors of the power gates can be used for charging the half banks during the wake-up mode and to sense the voltage of the internal power levels of the half banks. When the internal core voltage supply reaches a reasonable value, a wake up initiation of a next bank is performed. In such manner, the banks are serially charged using voltage sensing. Once the last half bank is charged, charging is completed. Upon completion of charging or any time thereafter, a second group of one or more transistors of the power gates can be used for a second mode of power gating. The first group of transistors of the power gates are smaller in size and/or number of the second group of transistors of the power gates.

Figure 4:
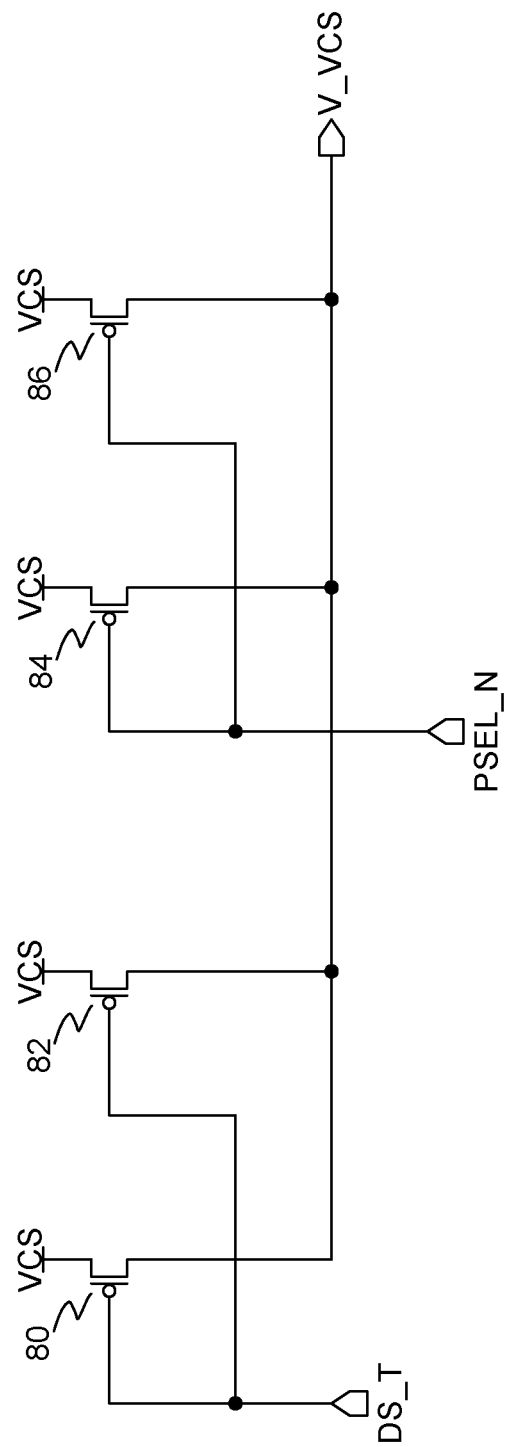
FIG. 4 illustrates dual mode power gates of the present disclosure.

FIG. 4 illustrates power gates of the present disclosure having two modes. The half banks can be gated by the power gates having two modes. The power gates comprise PMOS transistors 80-86 (also referred to as power switches). The PMOS transistors 80-86 are connected in parallel across a power supply VCS and an internal core voltage for a half bank, V_VCS. The gates of the PMOS transistors 80 and 82 are coupled to an input signal DS_T. The DS_T signal is generated by a corresponding bank wake-up circuit. The gates of the PMOS transistors 84 and 86 are coupled to an input signal PSEL_N. The PSEL_N signal is generated by the corresponding bank wake-up circuit.

The corresponding bank wake-up circuit can switch between using the transistors 80 and 82 via the DS_T signal and using the transistors 84 and 86 via the PSEL_N signal. The DS_T and PSEL_N signals have opposite values or substantially opposite values at any moment. For instance, when the PMOS transistors 80 and 82 are activated, the PMOS transistors 84 and 86 are not activated, and vice versa. The PMOS transistors 80 and 82 are smaller than the PMOS transistors 84 and 86. In addition, the number of transistors used for each mode can vary as well.

In the first mode for charging and sensing the internal core voltage, the PMOS transistors 80 and 82 are activated (i.e., closed or on) and the PMOS transistors 84 and 86 are not activated (i.e., open or off). The first mode is used for charging the internal voltage level V_VCS to VCS using the PMOS transistors 80 and 82 for waking up a corresponding half bank. In a second mode, the PMOS transistors 80 and 82 are deactivated (i.e., open or off) and the PMOS transistors 84 and 86 are activated (i.e., closed or on). The second mode can be used for operating the half bank in a functional mode. Typically, when all the half banks have reached the logic gate trip-point voltage for operation, the power gates are switched from the first mode to the second mode to operate the half banks.

Although the power gates are shown to have four PMOS transistors/switches. It can be appreciated that there are many pairs of transistors for waking up and for powering the memory array. These many pairs of transistors can be distributed across the width of the memory banks and be divided such that each couple of memory columns is assigned a couple of transistors per each mode. For instance, for every memory column, there can be four power switches.

Figure 5:
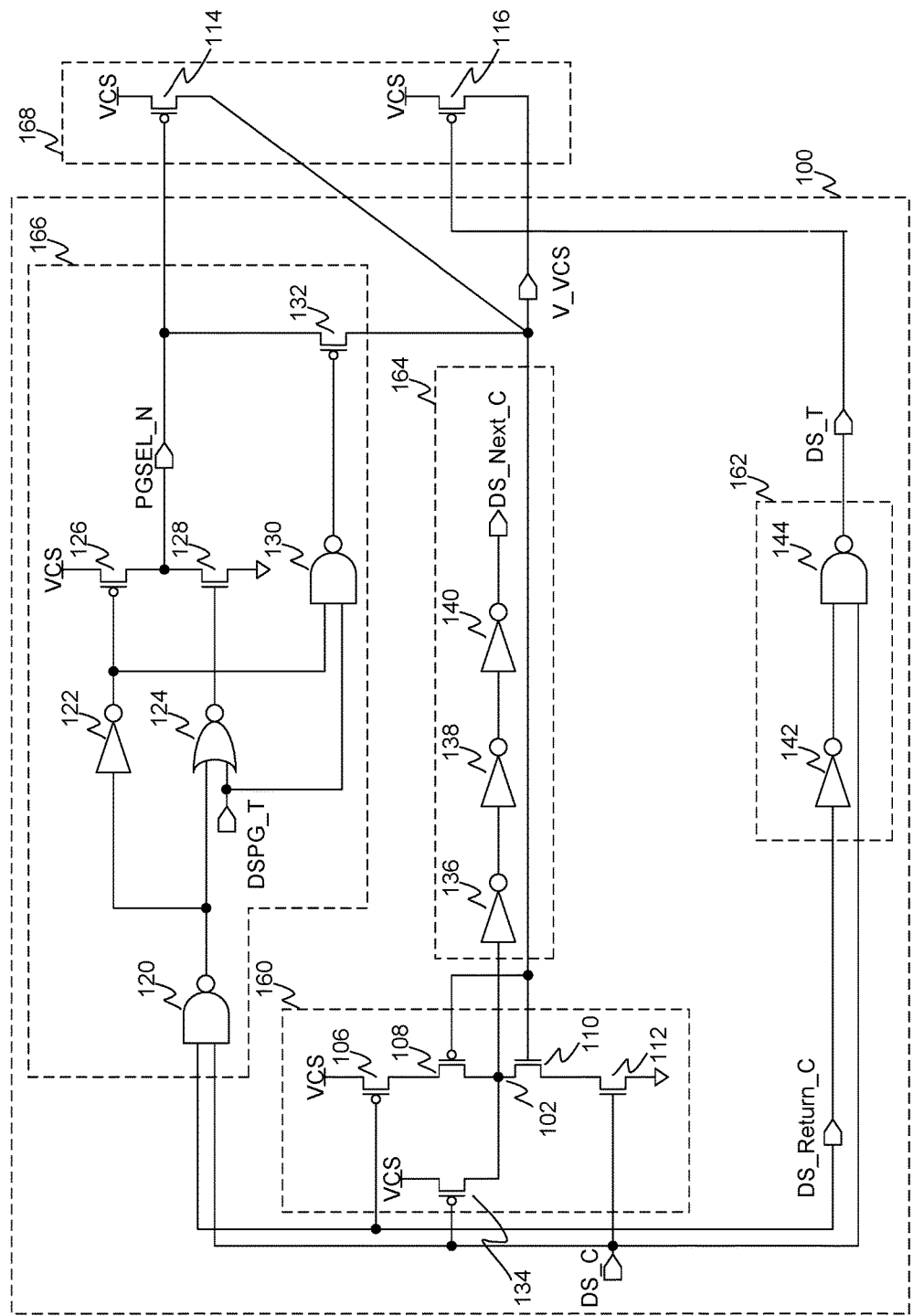
FIG. 5 illustrates a circuit diagram for a bank wake-up circuit and corresponding power gates of the present disclosure.

FIG. 5 illustrates a circuit diagram for a bank wake-up circuit and a power gate of the present disclosure. A memory device of the present disclosure can comprise memory banks, power gates, and bank wake-up circuits. The power gates are coupled to the memory banks for charging a core voltage supply for each of the memory banks, where the power gates can have a plurality of powering modes. The bank wake-up circuits are coupled to the power gates for selecting one of the plurality of power modes based on sensing the respective internal core voltage supply of the memory banks. It is appreciated that there can be multiple bank wake-up circuits, power gates, and memory banks as designed for the respective memory device. In order to aid in the understanding of the present disclosure, the following examples illustrates the connections between a single bank wake-up circuit and power gates for charging a corresponding memory bank.

Referring to FIG. 5, a bank wake-up circuit 100 of a memory device is coupled to power gates 168 of the memory device, where the power gates 168 can charge a corresponding memory bank (or half bank, quarter bank, etc., depending on the design of the respective memory device). The bank wake-up circuit 100 comprises a sensing gate 160, a next signal generation block 164, a first mode activation block 162 for a wake-up mode, and a second mode activation block 166 for an active mode.

The power gates 168 comprise PMOS transistors 114 and 116, where each transistor is used to provide for one of the powering modes. The transistor 116 is smaller than the transistor 114 (e.g., 2 or 3 times smaller), where the transistor 116 provides for a wake-up and sensing mode and the transistor 114 provides for a functional mode. It is understood that the relative number of transistors and sizes of the transistors of the power gates 168 can be varied depending on the design the respective memory device. The transistors for the wake-up mode should be smaller (and/or lesser in number) than the transistors used for the functional mode.

When a command to exit deep sleep is received for a memory bank (i.e., a wake-up mode is initiated), the PMOS transistor 116 is turned on for charging of the internal core voltage supply in the wake-up mode. A DS_Return_C signal and a DS_C signal are inputted to the bank wake-up circuit 100. The DS_Return_C signal indicates when all of the banks have woken (i.e., have been charged to the logic gate trip-point voltage for normal operations). Initially, the DS_Return_C signal is set to a low logic value i.e., ground, as a default setting. When the banks to be woken have all reached the logic gate trip-point voltage, the DS_Return_C signal is set to a high logic level, e.g., 1 or VCS, to indicate such state of the memory banks. The DS_C signal indicates whether the corresponding bank for the bank wake-up circuit 100 is in a wake-up mode. For instance, if the DS_C signal is set to a high logic value, a wake-up mode for the corresponding bank is performed. If the DS_C signal is at a low logic value, the wake-up mode is not activated and the corresponding bank is left in its current active state.

The DS_Return_C and DS_C signals are inputted to the second mode activation block 166. The second mode activation block 166 comprises NAND gates 120 and 130, inverter 122, NOR gate 124, PMOS transistors 126 and 132, and NMOS transistor 128. The DS_Return_C and the DS_C signals are inputted to the NAND gate 120. The output of the NAND gate 120 is coupled to inputs of the inverter 122 and the NOR gate 124. Another input of the NOR gate 124 is coupled to a signal deep-sleep_or_power-gate-true ("DSPG_T"). DSPG_T signal is activated (logic high) whenever the memory enters either deep-sleep mode or power-gating (light-sleep) mode. The DSPG_T signal is at a low logic level (i.e., 0) whenever the memory is in a wake-up mode or fully active. The output of the inverter 122 and the signal DSPG_T are coupled to the inputs of the NAND gate 130. The output of the NAND gate 130 is coupled to the gate of the PMOS transistor 132.

The PMOS transistor 126 and the NMOS transistor 128 are serially connected across the power supply VCS and ground. The serial connection between the transistors 126 and 128 generates a signal PGSEL_N. The transistor 132 connects across the signal PGSEL_N and the internal core voltage supply V_VCS of the corresponding memory bank. The gate of the transistor 126 is coupled to the output of the inverter 122. The gate of the transistor 128 is coupled to the output of the NOR gate 124. The generated signal PGSEL_N is coupled to the gate of the transistor 114 of the power gates 168 for operating whether the second mode is active or not.

During a wake-up mode, the DS_T signal is at a low logic level, i.e., ground, to activate the wake-up mode by turning on the PMOS transistor 116 of the power gates 168. The transistor 116 charges the internal power level V_VCS to the power supply VCS voltage when turned on. When the wake-up mode is activated, the PGSEL_N signal remains in a high logic level, i.e., VCS, to deactivate the active mode by turning off the PMOS transistor 114 of the power gates 168.

Furthermore, the sensing gates 160 can sense the voltage of the internal power level V_VCS. The sensing gates 160 comprises serially-connected PMOS transistors 106 and 108 and NMOS transistors 110 and 112 and a PMOS transistor 134. The transistor 134 maintains an output 102 of the sensing gates 160 near the power supply voltage VCS when the wake-up mode is not activated, i.e., when DS_C signal is at a low logic value. When the wake-up mode is initiated, then DS_C signal is at a high logic value, which turns off the transistor 134 and allows the serially connected transistors 106, 108, 110, and 112 to sense the internal core voltage supply of the corresponding memory bank.

When the corresponding memory bank is in a sleep mode, the internal core voltage supply V_VCS will be at a low logic value, i.e., ground. At ground and with the DS_C signal indicating that the memory bank is to be woken up, the PMOS transistors 106 and 108 will drive the output 102 to a high logic value, i.e., the power supply VCS. A high logic value for the output 120 indicates that the corresponding bank has not reached the logic gate trip-point voltage of 160 during the wake-up mode.

During the wake-up mode, when DS_C transitions to a high logic value and the internal power supply V_VCS charges up towards the VCS voltage, the NMOS transistors 110 and 112 will turn on and drive the output 102 to a low logic value. A low logic value for the output 102 indicates that the corresponding bank has reached the logic gate trip-point voltage during the wake-up mode and the next bank can be woken up. If the bank wake-up circuit 100 corresponds to the last memory bank to be woken up, then the preceding banks have all been charged to or beyond the logic gate trip-point voltage. In such case, the output 102 for this last bank circuit 100 can be used to generate the DS_Return_C signal to indicate to all of the bank wake-up circuits that those bank wake-up circuits can use the second mode transistors of their corresponding power gates for operating in a functional mode.

The next signal generation block 164 senses the output 102 of the sensing gates 160, and can generate a DS_Next_C signal for indicating whether a next bank is to be woken up. The next signal generation block 164 comprises serially-connected inverters 136, 138, and 140 and outputs the signal DS_Next_C to the next memory bank wake-up circuit. The output 102 of the sensing gates 160 is coupled to an input of the next signal generation block 164. The next generation block 164 inverts that input for output as the signal DS_Next_C or DS_Return_C. The DS_Next_C signal is inputted to a next bank wake-up circuit as the DS_C input signal to initialize the wake-up mode for the next bank wake-up circuit.

When the output 102 of the sensing gates 160 is at a low logic value, the next signal generation block 164 outputs a high logic value for the DS_Next_C signal. The high logic value is inputted to the next bank wake-up circuit to initialize the wake-up mode for that next bank wake-up circuit. When the output 102 of the sensing gates 160 is at a high logic value, the next signal generation block 164 outputs a low logic value for the DS_Next_C signal. The low logic value is inputted to the next bank wake-up circuit to maintain the state of that circuit.

Alternatively, if the bank wake-up circuit 100 corresponds to the last memory bank to be woken up, then the block next signal generation block 164 generates the DS_Return_C signal to all of the bank wake-up circuits.

The first mode of the power gates 168 (i.e., the wake-up mode) is operated by the first mode activation block 162. The first mode activation block 162 comprises an inverter 142 and a NAND gate 144. The inverter 142 receives the DS_Return_C signal as input. As previously mentioned, the DS_Return_C signal is generated by the bank wake-up circuit that corresponds to the last bank to be woken. If the current bank wake-up circuit 100 is the bank wake-up circuit that corresponds to the last bank, then this input can be directly coupled to the next signal generation block 164.

The inverter 142 inverts the DS_Return_C signal and inputs it to the NAND gate 144. Another input of the NAND gate 144 is coupled to the DS_C signal. The output of the NAND gate 144 generates the DS_T signal, which is used to operate the transistor 116 of the power gates 168. When the functional mode is activated, the DS_T signal is at a high logic value to turn off the wake-up transistor 116. The transistor 116 is connected across the power supply VCS and the internal core voltage supply V_VCS. The transistor 114 maintains the internal core voltage supply V_VCS for the corresponding bank near or at the power supply VCS. The gate of the transistor 114 is coupled to the output PGSEL_N of the second mode activation block 166.

Figure 6:
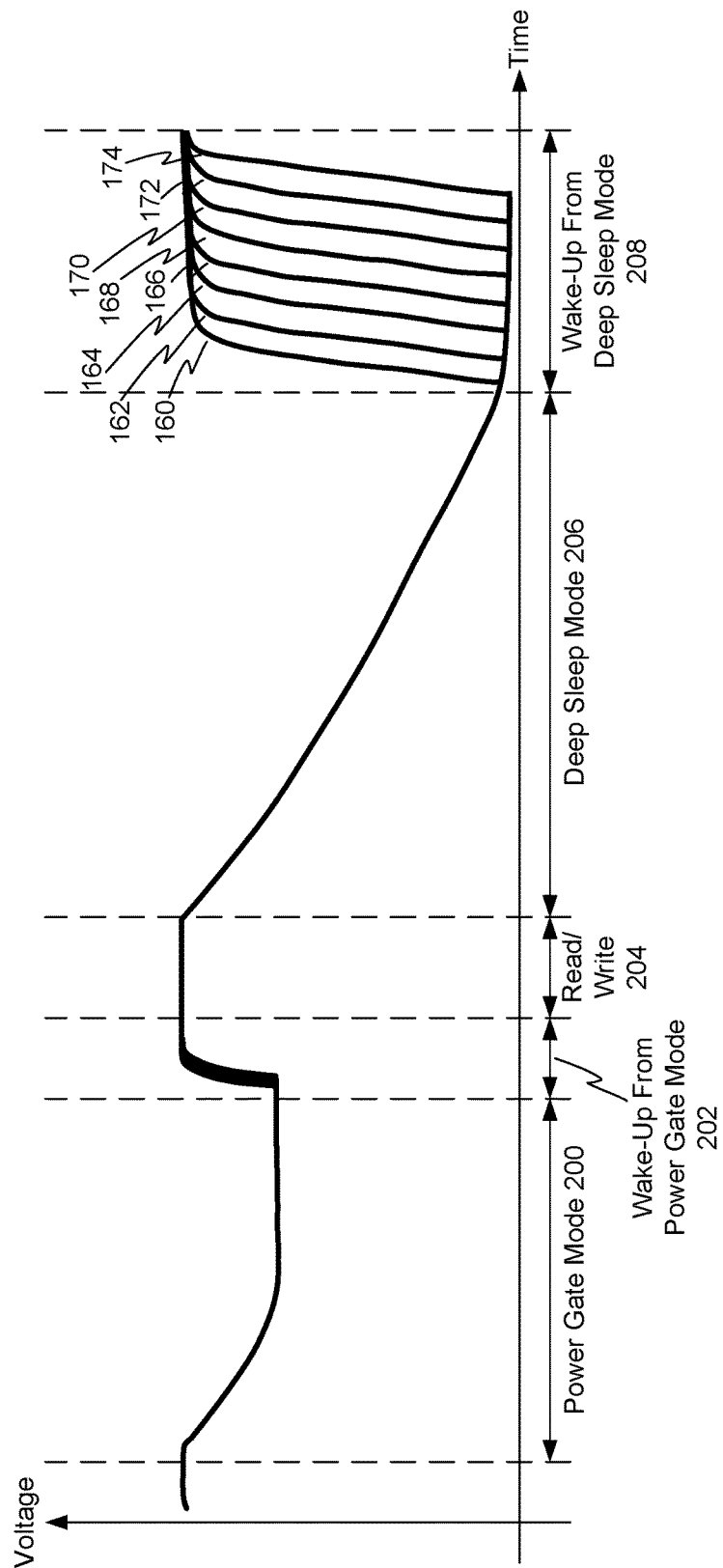
FIG. 6 illustrates a graph of core voltage supplies for memory banks being charged using a method of the present disclosure.

FIG. 6 illustrates a graph of core voltage supplies for memory banks being charged using a method of the present disclosure. Assuming there are eight memory banks (or eight half memory banks) to be powered, a graph of time versus voltage is provided to show the internal core voltage supply V_VCS for each of the eight banks in various modes. Bank wake-up circuits of the present disclosure can be used to wake up the eight memory banks from a power gate mode or a deep-sleep mode.

In a power gate mode 200, internal power supply voltages of the banks can drop about 100 mV or so depending on the design of the memory device. When the banks need to be used, corresponding bank wake-up circuits can charge those internal core voltage supplies to the power supply VCS, as shown in the wake-up from the power gate period 202. Now that the internal core voltage supplies are at the voltage VCS, reads, writes, and/or other memory commands can be performed in the read/write period 204.

When the memory banks are to be put back into a deep-sleep mode, then the internal power supplies are allowed to drop to ground in the deep-sleep period 206. When the memory banks are to be used, the memory banks can be woken in the wake-up from deep-sleep period 208. In such period, the memory banks are serially woken up one at a time using smaller transistors of the power gates of the present disclosure than the ones used in the wake-up from the power gate period 202.

When an internal core voltage supply 160 of a first one of the memory banks to be charged reaches a voltage that is high enough to turn on the sensing gate for the corresponding bank wake-up circuit, the signal DS_Next_C is set to a high logic value and is outputted to a next bank wake-up circuit to charge an internal core voltage supply 162 for the next one of the memory banks. This cycle ripples serially for the other internal core voltage supplies 164-174 for the remaining memory banks in a serial manner until all of the memory banks are charged.

When the last memory bank is charged to the logic gate trip-point voltage, the DS_Return_C signal is fed back to all of the bank wake-up circuits to switch the power gates to the functional mode, e.g., to use the bigger and/or more numerous transistors of the respective power gates for the memory banks.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skilled in the art.

We claim:

1. A memory device, comprising:
   memory banks, wherein each of the memory banks has a core voltage supply;
   power gates coupled to the memory banks for charging the core voltage supplies, wherein the power gates have a plurality of powering modes; and
   bank wake-up circuits coupled to the power gates for selecting one of the plurality of power modes for charging the memory banks during a wake-up mode,
   wherein the bank wake-up circuits sense the core voltage supplies during the wake-up mode, and
   wherein the bank wake-up circuits serially charge the memory banks as a function of the sensed core voltage supplies of the memory banks.

2. The memory device of claim 1 wherein the memory banks are in a sleep mode, and wherein, during the wake-up mode, the core voltage supplies are charged one at a time up to a logic gate trip-point voltage by corresponding ones of the power gates in a first power mode.

3. The memory device of claim 2 wherein one of the core voltage supplies is charged to the logic gate trip-point voltage.

4. The memory device of claim 3 wherein a next one of the core voltage supplies is charged after said one of the core voltage supplies has reached the logic gate trip-point voltage.

5. The memory device of claim 4 wherein a first bank wake-up circuit senses said one of the core voltage supplies, wherein a next bank wake-up circuit senses the said next one of the core voltage supplies, and wherein, when said one of the core voltage supplies reaches the logic gate trip-point voltage, the first bank wake-up circuit generates a signal to the second bank wake-up circuit to initiate charging of said next one of the core voltage supplies.

6. The memory device of claim 2 wherein when all of the core voltage supplies of the memory banks have reached the logic gate trip-point voltage, the corresponding power gates switch to a second mode, and wherein the second mode uses larger transistors than the first mode.

7. The memory device of claim 6 wherein the first mode of each of the power gates comprises a first set of transistors and the second mode of each of the power gates comprises a second set of transistors, and wherein the second set of transistors are two or more times larger than the first set of transistors.

8. The memory device of claim 7 wherein the first set of transistors is used for deep-sleep wake up and the second set of transistors is used for power-gate mode and light sleep wake up.

9. The memory device of claim 2 wherein when all of the core voltage supplies of the memory banks have reached the logic gate trip-point voltage, the corresponding power gates switch to a second mode, and wherein the second mode uses a greater number of transistors than the first mode.

10. The memory device of claim 9 wherein the first set of transistors is used for deep-sleep wake-up mode and the second set of transistors is used for a power gating mode and a light-sleep wake-up mode.

11. The memory device of claim 1 wherein each one of the bank wake-up circuits comprises a sensing gate for sensing a core voltage supply, a next signal generation block for generating a next control signal as a function of the sensed core voltage supply, a first mode activation block for controlling a first mode of the coupled power gates, and a second mode activation block for controlling a second mode of the coupled power gates, wherein said each one of the bank wake-up circuits receive a control signal to initiate said each one of the bank wake-up circuits and a return signal, and wherein the return signal indicates whether all of the memory banks have reached a logic gate trip-point voltage.

12. A method for a wake-up mode of a memory device, wherein the memory device has memory banks, power gates with a plurality of power modes, and bank wake-up circuits, comprising the steps of:
  sensing by the bank wake-up circuits of core voltage supplies of the memory banks; and
  serially charging the core voltage supplies using a first mode of the power modes of the power gates,
  wherein the first mode of the power modes is selected for charging as a function of the sensed core voltage supplies,
  wherein one of the core voltage supplies is charged until a logic gate trip-point voltage is reached, and
  wherein a next one of the core voltage supplies is charged after said one of the core voltage supplies has reached the logic gate trip-point voltage.

13. The method for a wake-up mode of claim 12 wherein a first bank wake-up circuit senses said one of the core voltage supplies, wherein a next bank wake-up circuit senses the said next one of the core voltage supplies, and wherein, when said one of the core voltage supplies reaches the logic gate trip-point voltage, the first bank wake-up circuit generates a signal to the second bank wake-up circuit to initiate charging of said next one of the core voltage supplies.

14. The method for a wake-up mode of claim 12 wherein when all of the core voltage supplies of the memory banks have reached the logic gate trip-point voltage, the corresponding power gates switch to a second mode, and wherein the second mode uses larger transistors than the first mode.

15. The method for a wake-up mode of claim 14 wherein the first mode of each of the power gates comprises a first set of transistors and the second mode of each of the power gates comprises a second set of transistors, and wherein the second set of transistors are two or more times larger than the first set of transistors.

16. The method for a wake-up mode of claim 15 wherein the first set of transistors is used for deep-sleep wake up and the second set of transistors is used for power-gate mode and light sleep wake up.

17. The method for a wake-up mode of claim 12 wherein when all of the core voltage supplies of the memory banks have reached the logic gate trip-point voltage, the corresponding power gates switch to a second mode, and wherein the second mode uses a greater number of transistors than the first mode.

18. The method for a wake-up mode of claim 12 wherein the first set of transistors is used for a deep-sleep wake-up mode and the second set of transistors is used for a power gating mode and a light sleep wake-up mode.

19. The method for a wake-up mode of claim 12 wherein each one of the bank wake-up circuits comprises a sensing gate for sensing a core voltage supply, a next signal generation block for generating a next control signal as a function of the sensed core voltage supply, a first mode activation block for controlling a first mode of the coupled power gates, and a second mode activation block for controlling a second mode of the coupled power gates, wherein said each one of the bank wake-up circuits receive a control signal to initiate said each one of the bank wake-up circuits and a return signal, and wherein the return signal indicates whether all of the memory banks have reached the logic gate trip-point voltage.

20. A memory device, comprising:
  memory banks, wherein each of the memory banks has a core voltage supply;
  power gates coupled to the memory banks for charging the core voltage supplies, wherein the power gates have a plurality of powering modes; and
  bank wake-up circuits coupled to the power gates for selecting one of the plurality of power modes for charging the memory banks during a wake-up mode,
  wherein the bank wake-up circuits sense the core voltage supplies during the wake-up mode,
  wherein the bank wake-up circuits serially charge the memory banks as a function of the sensed core voltage supplies of the memory banks,
  wherein, during the wake-up mode, the core voltage supplies are charged one at a time up to a logic gate trip-point voltage by corresponding ones of the power gates in a first power mode,
  wherein one of the core voltage supplies is charged to the logic gate trip-point voltage,
  wherein a next one of the core voltage supplies is charged after said one of the core voltage supplies has reached the logic gate trip-point voltage,
  wherein a first bank wake-up circuit senses said one of the core voltage supplies,
  wherein a next bank wake-up circuit senses the said next one of the core voltage supplies,
  wherein, when said one of the core voltage supplies reaches the logic gate trip-point voltage, the first bank wake-up circuit generates a signal to the second bank wake-up circuit to initiate charging of said next one of the core voltage supplies, wherein, when all of the core voltage supplies of the memory banks have reached the logic gate trip-point voltage, the corresponding power gates switch to a second mode, wherein the second mode uses larger transistors than the first mode, wherein the first mode of each of the power gates comprises a first set of transistors and the second mode of each of the power gates comprises a second set of transistors, wherein the second set of transistors are two or more times larger than the first set of transistors, wherein the first set of transistors is used for deep-sleep wake up and the second set of transistors is used for power-gate mode and light sleep wake up, wherein each one of the bank wake-up circuits comprises a sensing gate for sensing a core voltage supply, a next signal generation block for generating a next control signal as a function of the sensed core voltage supply, a first mode activation block for controlling a first mode of the coupled power gates, and a second mode activation block for controlling a second mode of the coupled power gates, wherein said each one of the bank wake-up circuits receive a control signal to initiate said each one of the bank wake-up circuits and a return signal, and wherein the return signal indicates whether all of the memory banks have reached the logic gate trip-point voltage.

* * * * *